(12) United States Patent
Gross

(10) Patent No.: US 10,871,524 B2
(45) Date of Patent: Dec. 22, 2020

(54) CURRENT MONITOR CIRCUIT

(71) Applicant: Hewlett-Packard Development Company, L.P., Spring, TX (US)

(72) Inventor: Ronald R Gross, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 91 days.

(21) Appl. No.: 16/337,080

(22) PCT Filed: Oct. 28, 2016

(86) PCT No.: PCT/US2016/059397
§ 371 (c)(1),
(2) Date: Mar. 27, 2019

(87) PCT Pub. No.: WO2018/080516
PCT Pub. Date: May 3, 2018

(65) Prior Publication Data
US 2020/0033422 A1 Jan. 30, 2020

(51) Int. Cl.
*G01R 31/40* (2020.01)
*G01R 19/165* (2006.01)
*H02H 3/24* (2006.01)
*G06F 1/26* (2006.01)

(52) U.S. Cl.
CPC ....... *G01R 31/40* (2013.01); *G01R 19/16566* (2013.01); *H02H 3/243* (2013.01); *G06F 1/26* (2013.01)

(58) Field of Classification Search
CPC .............. G01R 31/40; G01R 19/16566; G01R 19/2506; H02H 3/243; G06F 1/26

USPC .................... 324/764.01, 537, 500
See application file for complete search history.

(56) References Cited

U.S. PATENT DOCUMENTS

| | | | |
|---|---|---|---|
| 5,789,934 A | 8/1998 | Kolkowski et al. | |
| 6,201,371 B1 | 3/2001 | Kawabe et al. | |
| 7,519,837 B2 | 4/2009 | Smith et al. | |
| 7,793,117 B2 | 9/2010 | Smith | |
| 9,033,450 B2 | 5/2015 | Davis et al. | |
| 2007/0120560 A1* | 5/2007 | Rempt | G01N 27/82 324/238 |
| 2007/0285347 A1 | 12/2007 | Karaki | |
| 2008/0028246 A1 | 1/2008 | Witham | |
| 2011/0133732 A1* | 6/2011 | Sauber | G01R 33/0023 324/251 |

(Continued)

FOREIGN PATENT DOCUMENTS

| | | |
|---|---|---|
| EP | 0625814 A1 | 11/1994 |
| RU | 2572766 C2 | 1/2016 |
| WO | WO-2014019623 A1 | 2/2014 |

*Primary Examiner* — Giovanni Astacio-Oquendo
(74) *Attorney, Agent, or Firm* — Fabian VanCott

(57) ABSTRACT

A current monitor circuit includes a sense resistor coupled to a direct current (DC) power supply to sense a current signal, an operational amplifier (op-amp) coupled to the sense resistor to sense a voltage developed across the sense resistor, and a low-pass filter coupled to the op-amp and an analog-to-digital converter (ADC). The low-pass filter reduces aliasing due to out-of-band signal content. The current monitor circuit is coupled to the ADC to provide real-time measurements of power supply load current as input to an active power management (APM) firmware.

15 Claims, 7 Drawing Sheets

(56) References Cited

U.S. PATENT DOCUMENTS

2012/0228936 A1  9/2012  Kabbara et al.
2013/0265041 A1* 10/2013 Friedrich ............. G01R 15/207
                                                    324/260

* cited by examiner

CURRENT MONITOR CIRCUIT

BACKGROUND

Electronic devices such as printing devices, computing devices, display devices, and scanning devices, among many other electronic devices, may include a power supply that provides electrical power to the electronic device. A power supply internal to a housing of the electronic device may be used to provide an acceptable level of power to the electronic device.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
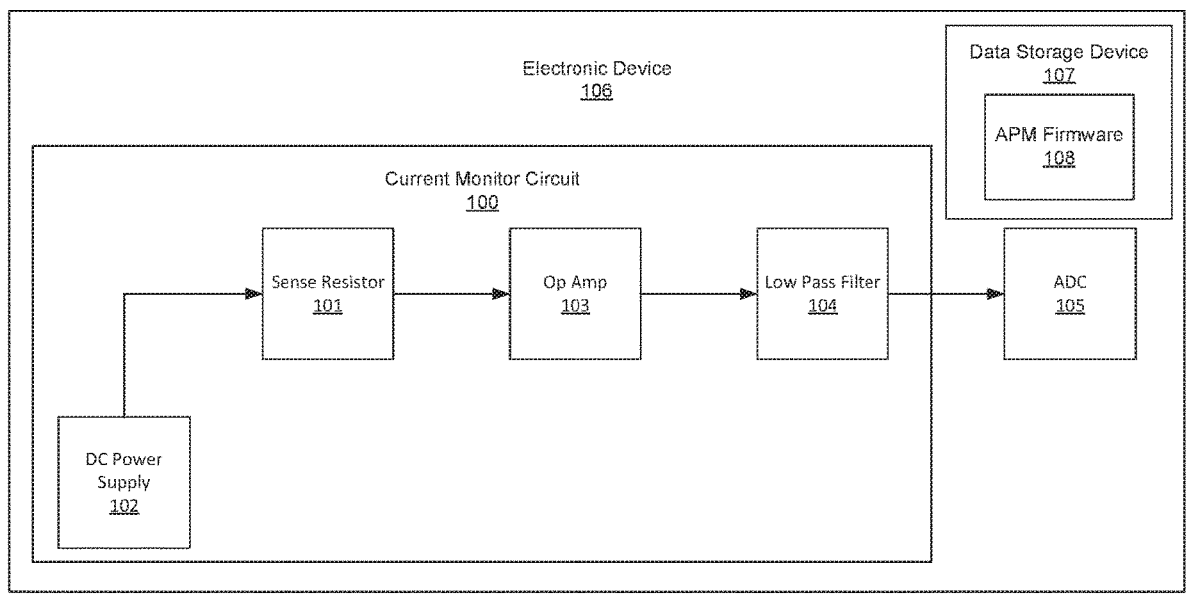
FIG. 1 is a block diagram of a current monitor circuit, according to one example of the principles described herein.

Although a larger power supply may be used to ensure the product may operate under all conditions, this larger power supply may prevent achieving the design targets for the product's size, cost, and other design considerations.

Further, using a lower-cost, smaller power supply to meet the physical package constraints may implies the power supply will have a lower power rating. This power supply, if allowed to be overloaded, may lead to product shutdown and/or malfunction. Product shutdown or malfunction may result in customer dissatisfaction because the work is interrupted or damaged and intervention is used to restore operation. This may result in undesirable economic repercussions for the manufacturers and sellers of the electronic devices.

One power supply design approach may yield a worst-case estimation of power used to run the electronic device by determining the maximum possible load that may exist. A suitable power supply may then be specified. However, this brute force approach results in a larger, more expensive power supply to meet the power demand most of the time, when the actual total load is less than the projected worst case.

Whether the power supply is located external to or within the electronic device such as, for example, the product, its size may still impact the overall product size and industrial design that affects utility and customer satisfaction. Therefore, there is increased pressure to minimize the size and cost, and, in turn, the rated output power of the power supply.

In some examples, active power management (APM) firmware (108) stored in a data storage device (107) of, for example, the electronic device (FIG. 1, 106) may be used, in contrast to the above-mentioned brute force method. An APM is firmware executed by, for example, a processing device associated with the electronic device (FIG. 1, 106), and runs on the electronic device to sum pre-determined estimates of power consumed by a number of power consumption elements of the electronic device referred to herein as "power clients." These power clients may include, for example, input/output (I/O) functions such as universal serial bus (USB) hosts, a Wi-Fi wireless communications module, digital control systems such as, for example, a multi-core processor, flash memory, DDR memory, and power supply regulators, and light emitting diode (LED) lighting for displays and indicators, among other types of power clients. The estimations of power drawn by these power clients are updated as their operating conditions change. Their sum, representing the total power supply (PS) load, is fed to the APM firmware which determines how and when to adjust operation of the electronic device. For example, the APM firmware may adjust the print mechanisms of a printing device such as the motors, the pens, and other power clients of the printing device to slow down the printed throughput to avoid a PS shutdown.

However, circuit efficiency and power consumption vary with load and operating conditions including the firmware employed, data rates within the electronic device, modes of operation of the electronic device, temperature, and component tolerances, among others. Thus, these modeled power client estimates are intentionally made conservative to err on the high side in order to avoid unanticipated PS shutdown or latch-off. In this case, much development work may be performed with frequent updates sent by hardware and system engineers to firmware engineers to update the maximum power reported as a function of each power clients' operating mode where possible. This type of utilization of human resources and associated expenses is not trivial and may unduly burden a corporation's research and development resources.

Examples described herein provide a reliable, cost-effective method and system of measuring a PS load to the electronic device, to allow for a relatively smaller and permissibly small PS to be used within the electronic device, to ensure the product may operate under all conditions, and to achieve a design target for the product's size and enclosure. Thus, examples described herein provide a current monitor circuit. In one example, the current monitor circuit may be incorporated within an electronic device. The current monitor circuit includes a sense resistor coupled to a direct current (DC) power supply to sense a current signal, at least one operational amplifier (op-amp) coupled to the sense resistor to sense a voltage developed across the sense resistor, and a low-pass filter coupled to the op-amp and an analog-to-digital converter (ADC), the low-pass filter to remove aliasing or false measurements due to out-of-band signal content. The current monitor circuit is coupled to the ADC to provide real-time measurements of PS load current as input.

The current monitor circuit further includes a unity gain buffer to prevent or reduce offset errors of interest which may be induced by a sufficient leakage current at an input to the ADC. A Zener diode may be included to reduce the PS voltage to meet a rated maximum voltage of the op-amp. The overall sensitivity of the current monitor circuit, relative to the ADC common, is set to allow measurement of the peak PS load current of concern while complying with the input voltage range of the ADC and allowable power loss in the current sense resistor.

The current monitor circuit further includes an automatic power shutdown feature implemented via appropriate choice of the Zener diode, and is used to reduce the PS voltage to the op-amp. The Zener diode provides sufficient supply voltage to the op-amp when the PS voltage is at its normal operating voltage. Further, the Zener diode does not provide the supply voltage to the op-amp when the PS voltage is reduced in order to provide for power savings and product OFF modes or power states. Thus, the Zener diode may be used in the current monitor circuit in an electronic device in examples where the electronic device changes from an operating mode or power state to a power-saving mode such as, for example, a standby or an off mode or power state.

The current monitor circuit's low pass filter cutoff frequency may be selected to allow the ADC and other measuring systems to detect and respond quickly enough to PS transient loads that exceed the PS's internal current limit. This sampling rate may be selected, consistent with the low-pass filter (LPF) cutoff frequency, in order to implement a control system bandwidth for a desired level of system performance. To effectively measure a signal with, for example, a 50 Hz bandwidth, a sampling rate of at least twice the highest frequency of significance in the signal may be used per the Nyquist rate that satisfies the Nyquist sampling criterion. Thus, for this one example, an approximately 100 Hz minimum sampling rate may be used which implies a maximum period between samples of approximately 10 ms.

The current monitor circuit may include a voltage divider coupled between the sense resistor and a positive terminal of the op-amp to provide a positive offset to compensate for an offset within the op-amp and ADC.

Examples described herein also provide a system for monitoring a current load of a PS. The system includes a direct current (DC) PS to supply power to an electronic device, and a current monitor circuit. The current monitor circuit includes a sense resistor coupled to a direct current (DC) PS to sense a current signal, at least one operational amplifier (op-amp) coupled to the sense resistor to amplify the voltage developed across the sense resistor, and a low-pass filter coupled to the op-amp and an analog-to-digital converter (ADC). The low-pass filter removes aliasing or false measurements due to out-of-band signal content. Executable computer readable code may be stored on a memory device to, when executed by a processing device, compute a PS load based on the output of the current monitor circuit and regulate power distributed through the electronic device based on the PS load using active power management (APM) firmware (108).

The current monitor circuit may further include an automatic power shutdown circuit. The Zener diode blocks power to the current monitor circuit if the supply voltage operating the current monitor circuit changes from a higher voltage in an operating mode to a reduced voltage in a power-saving mode such as Sleep or Off. The current monitor circuit may further include a unity gain buffer to remove a leakage current within the ADC input. Further, in one example, the current monitor circuit is coupled to the ADC input to provide real-time measurements of PS load current.

Examples described herein also provide a computer program for monitoring a current load of a power supply. The product includes a computer readable storage medium comprising computer usable program code embodied therewith. The computer usable program code, when executed by a processor, computes a PS load based on the output of a current monitor circuit.

The current monitor circuit includes a sense resistor coupled to a direct current (DC) PS to sense a current signal, at least one operational amplifier (op-amp) coupled to the sense resistor to sense a voltage developed across the sense resistor, and a low-pass filter coupled to the op-amp and an analog-to-digital converter (ADC). The low-pass filter prevents or reduces aliasing or false measurements due to out-of-band signal content. The computer usable program code, when executed by a processor, also regulates power distributed through the electronic device based on the PS load using active power management (APM) firmware (108). In one example, the current monitor circuit further includes a buffer op-amp to prevent or reduce offset errors induced by a leakage current at the ADC or an optional multiplexer coupled between the current monitor circuit and the ADC. The system may use active power management (APM) firmware (108) to regulate power to at least one controllable load distributed through the electronic device based on the measured time-varying PS load, including characterizable and uncharacterizable loads of a number of subsystems of the electronic device, powered by the PS to which the current monitor circuit is coupled. The product further includes computer usable program code to, when executed by the processor, sample, with the ADC, the voltage output by the current monitor circuit at a suitable sampling rate. In one example, the sampling rate may be at least once every 10 ms, although slower rates may also be used when consistent with the system design. However, 10 ms is one example of a sampling rate, and slower or faster sampling rates may be used.

Even still further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a block diagram of a current monitor circuit (100), according to one example of the principles described herein. The current monitor circuit (100) may be included within an electronic device (106). As mentioned above, rather than using an external power supply (102) which uses an external DC output cable, the electronic device (106) includes elements that provide for the power supply (102) to be housed or embodied within the electronic device (106), The electronic device (106) may be any device that consumes electricity including, for example, a printing device, a computing device, a scanning device, a display device, a gaming device, other types of electronic devices, or combinations thereof.

The current monitor circuit (100) includes a sense resistor (101) coupled to a direct current (DC) power supply (PS) (102) to sense a current signal of the DC PS (102). The current monitor circuit (100) also includes at least one operational amplifier (op-amp) (103) coupled to the sense resistor (101) to sense a voltage developed across the sense resistor (101). In examples described herein, the at least one op-amp (103) may include two op-amps where the two op-amps perform different functions within the current monitor circuit (100). An example of the current monitor circuit (100) including two op-amps will be described below in connection with FIGS. 3 and 7.

A low-pass filter (104) may be coupled to the op-amp (103) and an analog-to-digital converter (ADC) (105). The ADC (105) may be any hardware device or element that provides analog signal conversion for digital processing. The low-pass filter (104) prevents or reduces aliasing due to out-of-band signal content. The current monitor circuit (100) is coupled to the ADC (105) to provide real-time measurements of PS load current. More details regarding the current monitor circuit (100) will now be described in connection with FIGS. 2 and 3.

Figure 2:
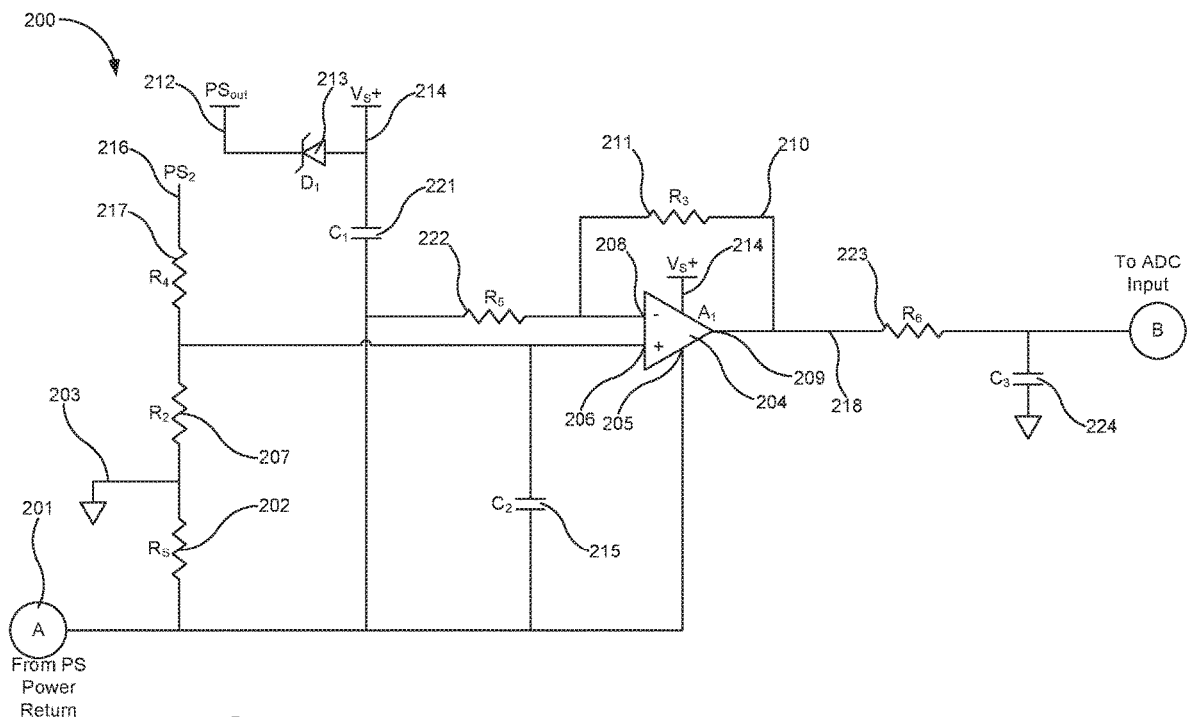
FIG. 2 is a diagram of a current monitor circuit, according to another example of the principles described herein.

FIG. 2 is a diagram of a current monitor circuit (200), according to another example of the principles described herein. The current monitor circuit (200) may be embodied on or integrated into a mother board of the electronic device (FIG. 1, 106), a main electronics circuit board within the electronic device (FIG. 1, 106), as part of an application-specific integrated circuit (ASIC), as an individual integrated circuit, or as part of or in another form of integrated circuit design. The current monitor circuit (200) is positioned between the power return of a PS (FIG. 1, 102) at a point designated by "A" (201), and an ADC (FIG. 1, 105) as designated by "B" which indicates the point of output of a signal to the ADC (105). Node A (201) connects to the PS regulated output voltage return terminal, and serves as a connector to the PS (102) and a return to the PS (FIG. 1, 102). This allows all the loads within the current monitor circuit (100) to have a common return path to a signal return or ground (203). Further, the portion of the node to the right of the junction of $R_S$ (202) with the line connected to node A (201) is a low-current signal branch. This low-current signal branch acts as a signal return for the op-amps (204, 304) and carries low-level currents. This low-current signal branch does not include any common impedance with the high-current return from $R_S$ (202) to terminal A (201) in order to prevent or reduce a possibility of impaired performance in the current monitor circuit.

The current monitor circuit (200) may include a sense resistor ($R_S$) (202) located in series between the signal return or ground (203) and the PS return (A) (201) of the PS (FIG. 1, 102). Based on the circuit design of FIG. 2, very little current flows through the remainder of the nodes coupled to the PS return (A) (201) of the PS (FIG. 1, 102) due to the op-amp circuits and bias resistors within the current monitor circuit (200). Thus, all the PS load current being sensed flows through the sense resistor (202). In one example, the sense resistor (202) is a 0.1 ohm (1%) resistor. However, the sense resistor (202) and all other resistive elements described herein may have less or more resistance based on desired voltage and current characteristics of the current monitor circuit (200).

The voltage developed over the sense resistor (202) has a direct linear relationship with the current produced by the PS (FIG. 1, 102), and may be amplified before it is measurable by the ADC (FIG. 1, 105). In one example, the voltage developed over the sense resistor (202) is a part of the input to a non-inverting input (+) (206) of the op-amp $A_1$ (204). In response, the output voltage of the op-amp $A_1$ (204) is a function of the current supplied by the PS (FIG. 1, 102). The ADC (FIG. 1, 105) used in such applications measures positive polarity signals such as those above the ground (203) potential. The voltage at the op-amp $A_1$ (204) non-inverting input (+) (206) relative to the ground terminal (205) of the op-amp $A_1$ (204) is equivalent to the voltage across the sense resistor (202) plus the applied offset voltage across a resistor $R_2$ (207). In one example, $R_2$ (207) is a 1,000 (1 K) ohm resistor. With a negative feedback loop (210), the op-amp $A_1$ (204) will create the same voltage at the inverting input (−) (208) of the op-amp $A_1$ (204) as presented at the non-inverting input (+) (206) of the op-amp $A_1$ (204). In one example, the feedback loop (210) includes a feedback resistor ($R_3$) (211). In one example, $R_3$ may be a 10,000 (10K) ohm resistor. Because of the resistor ratios connected to the op-amp ($A_1$) (204) and because no current is flowing into the op-amp ($A_1$) (204), a known gain relationship to the output voltage will be achieved. In one example, where the sense resistor (202) may be 0.1 ohms, the change in voltage at the output (209) of the op-amp ($A_1$) (204) is approximately 1 volt per ampere (1 V/A) of the current that flows through the sense resistor (202).

In one example, the primary DC output ($PS_{out}$) (212) of the PS (FIG. 1, 102), is approximately 32 volts and is connected to the current monitor circuit (200), A Zener diode ($D_1$) (213) is also included in the current monitor circuit (200) and associated with the $PS_{out}$ (212). The Zener diode ($D_1$) (213) allows current to flow from its anode to its cathode like other semiconductor diodes, but also permits current to flow in the reverse direction when its Zener voltage is reached. In one example, the op-amp ($A_1$) (204) uses a minimum of approximately 6 to 7 volts at the op-amp positive power supply ($V_s+$) (214) in order to produce a voltage at the output (209) of approximately 0 to 3.3 volts to comply with the ADC input conversion range. Further, the PS (FIG. 1, 102) regulated output voltage ($PS_{out}$) (216) may approach or exceed that of the maximum supply voltage rating of the op-amp ($A_1$) (204) such as, for example, 35-volts. Thus, the Zener diode ($D_1$) (213) ensures the voltage supplied to the op-amp ($A_1$) (204) is in a range that eliminates the possibility of exceeding the voltage rating of the op-amp ($A_1$) (204) while still powering the op-amp ($A_1$) (204). In one example, a 16V Zener diode ($D_1$) (213) is used to produce approximately 16 volts from the approximate 32 volts of the $PS_{out}$ (212). The Zener diode ($D_1$) (213) also ensures that an operating voltage such as the above-mentioned 6 to 7 volts minimum is supplied to the op-amp ($A_1$) (204).

The current monitor circuit (200) may further include a capacitor ($C_1$) (221) after the voltage-dropping Zener diode $D_1$ (213) to provide the AC bypass and filtering for the op-amp ($A_1$) (204) power supply thus generated, $V_s+(214)$, which in one example is approximately 16V DC. In one example, capacitor $C_1$ (221) may be a ceramic 1 uF value rated at 25V to accommodate this generated supply voltage and provide adequate low impedance at high frequency.

The current monitor circuit (200) may also include a number of additional elements including a filter capacitor ($C_2$) (215). In one example, the filter capacitor ($C_2$) (215) is a 0.1 microfarad (ρF) capacitor. The filter capacitor ($C_2$) (215) is used to reduce high frequency out-of-band components of noise that may exist even on a suitable well-regulated DC supply ($PS_2$) (216) and in the sensed PS load signal developed across $R_S$ (202).

The $PS_2$ (216) is generated elsewhere on, for example, a circuit board on which the current monitor circuit (200) exists. $R_2$ (207) and a resistor ($R_4$) (217) located between $PS_2$ (216) and $R_2$ (207) function as a voltage divider, and, in one example, divides the voltage of $PS_2$ (216) to approximately 16 millivolts (mV). In one example, $R_4$ may be a 200,000 (200K) ohm resistor. Combined with the $PS_2$ (216) voltage, the voltage divider (207, 216, 217) provides a positive offset to compensate for the maximum specified offset present at the op-amp ($A_1$) (204) and the maximum specified offset of the ADC (FIG. 1, 105) to ensure the ADC may produce a valid measurement of PS (FIG. 1, 102) load current over the range of interest.

As shown in FIG. 2, the current monitor circuit (200) may include resistors $R_5$ (222) and $R_3$ (211) connected from the inverting input (−) (208) of the op-amp $A_1$ (204) to the low-current branch of the PS return (A) (201) and op-amp ($A_1$) (204) output (209), respectively, in order to provide the stable negative feedback ratio for sufficient voltage gain to produce the desired monitor sensitivity in volts per amp of DC PS (FIG. 1, 102) load current. In one example, $R_5$ may be a 1,000 (1K) ohm resistor, and $R_3$ (211) may be a 10,000 (10K) ohm resistor. Thus, the voltage provided via the voltage divider (216, 207, 217) is connected in series (i.e., summed) with the voltage provided by $R_S$ (202); that summation is amplified via the op-amp ($A_1$) (204) to obtain a voltage $V_m$ at the output (209) of the op-amp ($A_1$) (204), relative to the PS return (A) (201), which may be defined as follows:

$$V_m = \left(\left(1 + \frac{R_3}{R_5}\right) * V_s\right) \quad \text{Eq. 1}$$

where $V_s$ is the voltage that appears between the non-inverting input terminal (206) and Op-amp $A_1$ (204) signal return (205). $V_s$ is equal to the sum of the sensed PS load current signal developed across $R_s$ (202) plus the fixed offset voltage across $R_2$ (207) due to $PS_2$ (216), $R_4$ (217), and $R_2$ (207). In one example, one plus the ratio $R_3/R_5$ may equal approximately 11. The signal measured at the ADC (FIG. 1, 105), connected at node B, relative to the signal ground (203), is per Equation 1 but reduced by the voltage developed across the sense resistor, $R_s$ (202).

As mentioned above, all the return current that returns to the PS (FIG. 1, 102), returns through the PS return (A) (201). The PS return (A) (201) is connected to the circuitry of the current monitor circuit (200) and associated main board circuitry. Further, the PS return (A) (201) collects current from the power return pin (205) of the op-amp ($A_1$) (204) since it has the lowest voltage potential within the current monitor circuit (200).

As mentioned herein, the change in voltage measured by the ADC (FIG. 1, 105) at the output (209) of the op-amp ($A_1$) (204) is approximately 1 volt per ampere (1 V/A) of the current that flows through the sense resistor (202). This sensitivity allows measurement up to at least a three-ampere peak in cases where the ADC (FIG. 1, 105) input range is 0 to 3.3V.

Per the example of component values described for the current monitor circuit herein (200, 300, 400), the nominal voltage measured by the ADC (FIG. 1, 105), $V_{sense}$, relative to circuit digital ground (203), is a combination of intended nominal DC offset voltage and the sensed PS load current. The PS Load current may be computed from the measured value, $V_{sense}$, per this Equation;

$$PS_{Load\,(A)} = (V_{sense} - 0.181\text{ V}) * 1\frac{A}{V} \quad \text{Eq. 2}$$

A low-pass filter including a capacitor ($C_3$) (224) and a resistor ($R_8$) (223) are included within the current monitor circuit (200). The low-pass filter (223, 224) provides reduction of high frequency noise that may be beyond a sampling rate of the ADC (FIG. 1, 105). The low-pass filter (223, 224) passes signals with a frequency lower than a certain cutoff frequency, attenuates signals with frequencies higher than a cutoff frequency, and conditions signals output by the op-amp ($A_1$) (204) prior to analog-to-digital conversion performed by the ADC (FIG. 1, 105). Reduction of the high frequency components prevents or reduces false measurements by serving as an anti-aliasing filter in this manner. In one example, $R_6$ (223) is a 3,320 (3.32K) ohm resistor. In one example, the capacitor ($C_3$) (224) is a 1.0 microfarad (μF) capacitor. Combined, these two component values, in one example, implement a low pass filter with a cutoff frequency of approximately 48 Hz.

The low pass filter (223, 224) prevents or reduces aliasing in measurements of the ADC (FIG. 1, 105) due to out-of-band signal content. However, due to the limited bandwidth of most low-cost op-amps, which may otherwise impair the filtering efficiency of the low pass filter (223, 224), a secondary low-pass filter operating at higher frequency may be implemented using the capacitor ($C_2$) (215).

The minimum sampling rate, with the low pass filter's (223, 224) response, may be once every 10 ms based on the Nyquist sampling criterion. Given the over-current protection (OCP) timeout is 760 ms in many of target power supplies, this recommended sampling rate allows for a reasonable response time for tracking and responding to peak system power consumption in real time to avoid a PS shutdown. A shorter resistor/capacitor time constant may be used by changing the post low pass filter (223, 224) values, within op-amp load limits, to allow higher update rates.

The side-effect of the added low pass filter resistance of, for example, 3.32K ohms via $R_6$ (223) between the low output resistance of the op-amp ($A_1$) (204) and the ADC (FIG. 1, 105), increases the possibility of a false reading of current at the ADC (FIG. 1, 105). For example, if there is a leakage current into the ADC (FIG. 1, 105), that current will flow through $R_6$ (223), and cause a false reading of voltage because of the voltage drop that is incurred instead of sensing the output voltage of the op-amp ($A_1$) (204). Thus, the DC resistance of the low-pass filter (223, 224) may, in combination with the leakage current at the input to the ADC (FIG. 1, 105), induce some measurement offset error.

Figure 3:
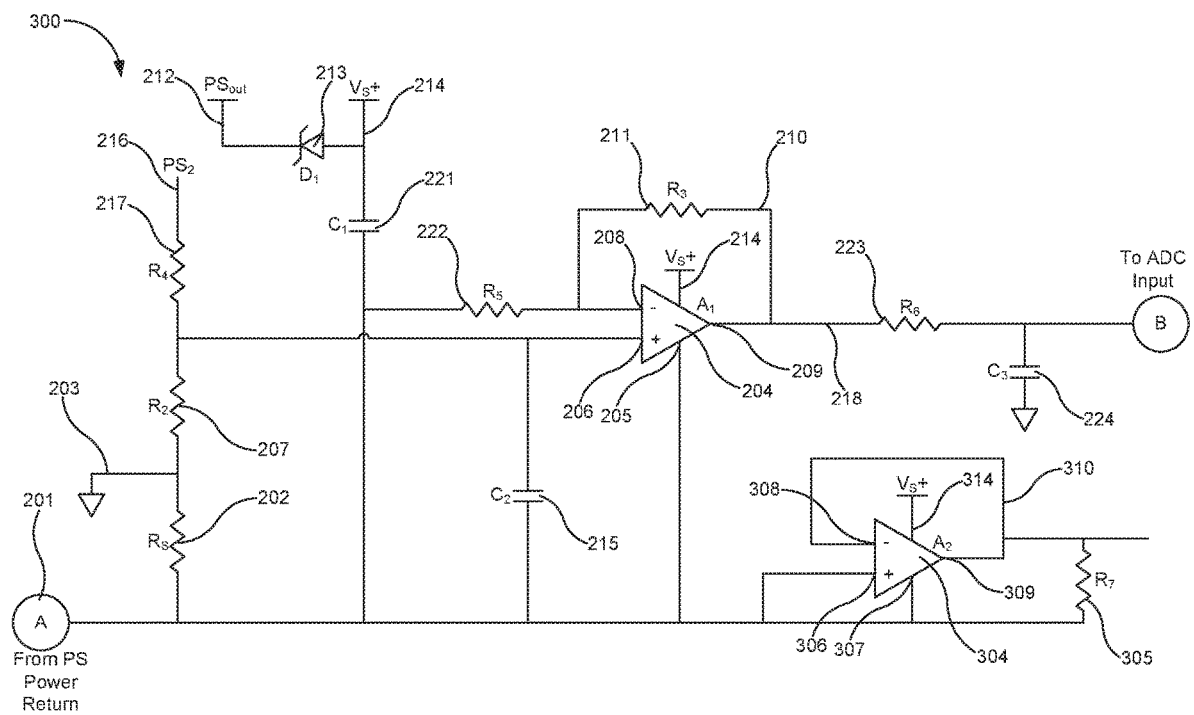
FIG. 3 is a diagram of a current monitor circuit, according to yet another example of the principles described herein.
Figure 7:
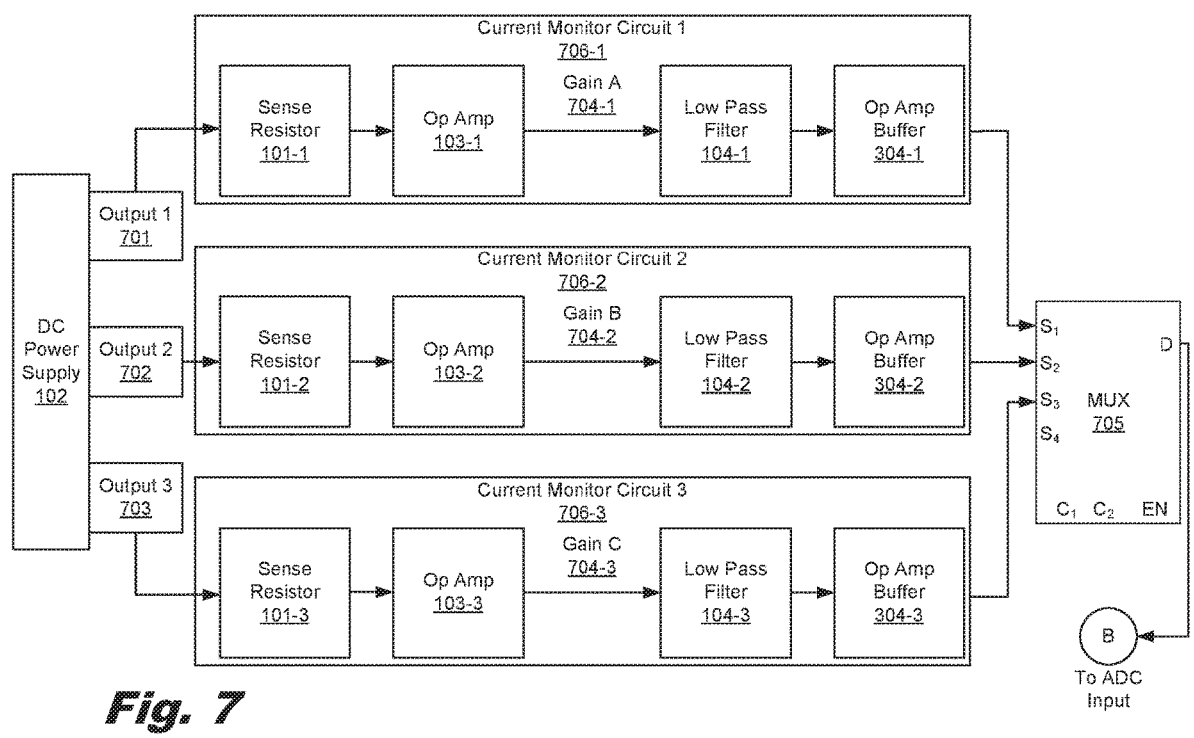
FIG. 7 is a diagram of an extended current monitor circuit, according to one example of principles described here.

If access to a low-leakage ADC input is not available, then the current monitor circuit (200) may be modified by including another op-amp ($A_2$) (FIG. 3, 304) which may be available in the same package as the op-amp ($A_1$) (204). The op-amp ($A_2$) (304) will then serve as a unity-gain buffer following the low-pass filter (223, 224), the resulting configuration as depicted in FIG. 7. FIG. 3 is a diagram of a current monitor circuit (300) when using a dual op-amp component for $A_1$ (204) and the current buffer function using the second op-amp $A_2$ (304) is not used, according to yet another example of the principles described herein. Similarly-numbered elements included in FIG. 2 and described in connection with FIG. 2 designate similar elements within the current monitor circuit (300) of FIG. 3.

Figure 4:
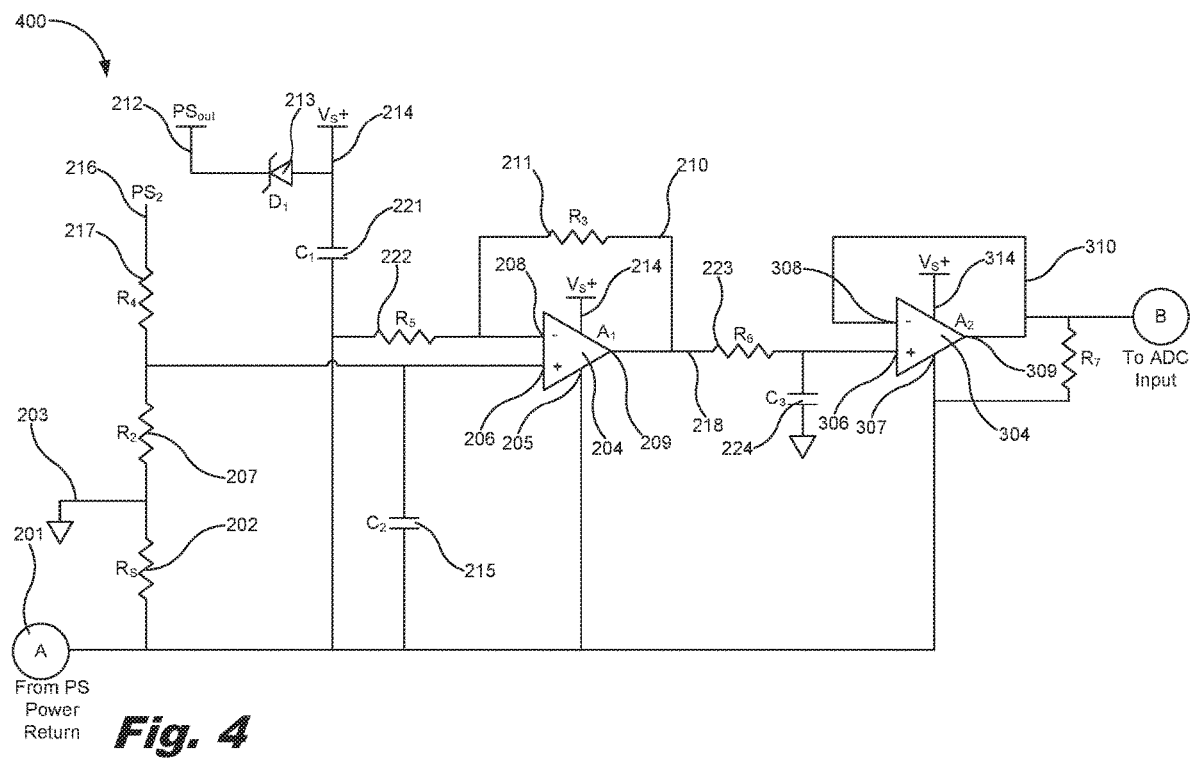
FIG. 4 is a diagram of a current monitor circuit, according to still another example of the principles described herein.

FIG. 4 is a diagram of a current monitor circuit (400), according to still another example of the principles described herein. Similarly-numbered elements included in FIGS. 2 and 3, and described in connection with FIGS. 2 and 3 designate similar elements within the current monitor circuit (400) of FIG. 4. FIG. 4 depicts another example of the current monitor circuit (200) of FIG. 2 where the op-amp ($A_2$) (304) is coupled to the low-pass filter (223, 224) at the node between the capacitor ($C_3$) (224) and a resistor ($R_6$) (223).

In this configuration, the op-amp ($A_2$) (304) serves to further buffer the output (B) of the current monitor circuit (200) of FIG. 2, for example. When driving an ADC input with input leakage current, which could induce variable offset errors in measured signal, the circuit design of FIG. 4 further buffers the output. The output node (309) of the op-amp ($A_2$) (304) is the signal, and is a function of the PS load current flowing through $R_S$ (202) to be measured by the ADC (FIG. 1, 105).

The addition of the op-amp ($A_2$) (304) in the current monitor circuit (300) per FIG. 4 may allow driving any available analog multiplexer or ADC input, regardless of its leakage current specifications. The additional offset voltage of the added op-amp ($A_2$) (304) is also accommodated by the DC offset applied from the +3.3 V $PS_2$ (216), A 10K ohm load supplied by a resistor (R7) (305) located between the output (309) of the op-amp ($A_2$) (304) and its return supply pin (307) which is connected to the PS return (A) (201), may ensure an adequate low-voltage output range. The use and value of this load resistance may be dependent upon the op-amp chosen for $A_2$ (304), as described by its manufacturers datasheet. In one example, the op-amps ($A_1$, $A_2$) (204, 304) may be included in the same integrated circuit package because such an arrangement of hardware may be less expensive to manufacture. Further, in this example, the integrated circuit package may be a low-cost dual op-amp such as the LM358 manufactured and distributed by Texas Instruments, Inc.

If using a dual op-amp for $A_1$ and the buffer application of $A_2$ is not included, $A_2$ may be configured to avoid affecting the operation of $A_1$. This may be implemented as depicted in FIG. 3, where the non-inverting input (+) (306) and a ground terminal (307) of the op-amp ($A_2$) (304) are coupled to the PS return (A) (201). The op-amp ($A_2$) (304) is powered at the op-amp positive power supply ($V_S+$) (314) using approximately 6 to 7 volts as described above in connection with the op-amp positive power supply ($V_S+$) (214) of the op-amp ($A_1$) (204). Op-amp $A_2$ (304) also includes a feedback loop (310) connecting its output to its inverting input (−) (308).

In the example of FIG. 4, the output to the ADC (FIG. 1, 105) is taken from the output (309) of the op-amp buffer ($A_2$) (304). As a buffer, op-amp $A_2$ (304) decouples the leakage current for the ADC (FIG. 1, 105) to provide the correct output of op-amp $A_1$ (204) to the ADC input (FIG. 1, 105) without causing a voltage drop through the low-pass filter (223, 224).

With regard to the location of the current monitor circuit (200, 300, 400) and the packing thereof, in one example, the $R_S$ (202) current monitor circuit (200, 300, 400) may be placed close to the PS return (A) (201) (i.e., the PS return) to provide for best detection of the sensed current signal. Further, in one example, the low-pass filter (223, 224) including a −3 dB cutoff at approximately 48 Hz, nominal may be placed close to the input of the ADC (FIG. 1, 105) to reduce offset injected by noisy adjacent traces which may be avoided as much as practical. Still further, coupling of injected voltage from any adjacent power inductors, whether mounted above or below the routed signal layer, may be avoided to prevent or reduce inducing noise and errors from adjacent circuits.

As to application of the current monitor circuit (200, 300, 400) with some PS modules, the maximum load current peaks may be less than the 3 A allowed by the circuit designs described herein. For example, if the peaks are 1.5 A maximum, twice the current monitor circuit's (200, 300, 400) circuit gain at amplifier $A_1$ (204) may be used with a corresponding halving of the offset voltage added to the current sense resistor $R_s$ (202) via $PS_2$ (216), $R_4$ (217) and $R_2$ (207). In this example, the op-amps (204, 304) have a minimum 10K ohm load to ensure their outputs may swing low enough at low output voltage conditions. In this example, the $A_1$ (204) load is provided without additional elements via the existing 10K feedback loop resistor ($R_3$) (211). To increase the gain sensitivity, $R_S$ (202) may be doubled to approximately 0.2 ohms, or $R_3$ (211) may be doubled to 20K ohms. In the latter case where the feedback resistor value $R_3$ (211) is doubled, a 20K load resistor (not shown) may be added between the $A_1$ op-amp (204) output and power return (201) to maintain sufficient op-amp load to achieve the lowest valid output voltage.

Turning again to FIGS. 2 and 3, the Zener diode ($D_1$) (213) may be used during a shift of the electronic device (106) from one power mode to another. ENERGY STAR is a United States government-backed voluntary labeling program that helps customers and organizations save money and reduce energy consumption by identifying factories, office equipment, home appliances, electronics, and other devices that have superior-rated energy efficiency. Per the U.S. Department of Energy's (DOE) website describing ENERGY STAR, in 1992, the U.S. Environmental Protection Agency (EPA) introduced ENERGY STAR as a voluntary labeling program designed to identify and promote energy-efficient products to reduce greenhouse gas emissions. Computers and monitors were among the first labeled products. Through 1995, the EPA expanded the label to additional office equipment products and residential heating and cooling equipment. In 1996, EPA partnered with the U.S. DOE for particular product categories. The ENERGY STAR label is now on major appliances, office equipment, lighting, home electronics, new homes, and commercial and industrial buildings and plants. ENERGY STAR certification is often a prerequisite for government purchase contracts and for some regulatory agencies in various countries.

The current monitor circuit described herein (200, 300, 400) may consume several milliamps of current from the PS (FIG. 1, 102) when its output voltage, $PS_{out}$ (212), is at an operating voltage for the electronic device (FIG. 1, 106), which in one example, may be 32V. The current monitor circuit (200, 300, 400) described herein may take advantage of Zener diode $D_1$ (213) to reduce the current monitor circuits (200, 300, 400) power consumption during modes of operation of the electronic device (FIG. 1, 106) when that circuit function is not used. The benefit of such a power savings contributes at least partially to enabling the electronic device (FIG. 1, 106) to achieve ENERGY STAR standards.

An example regarding the application of the current monitor circuit (200, 300, 400) in a printing device will now be provided. A printing device may include three modes of operation; namely Off, Sleep, and Active (which includes Idle). In support of these modes, the PS (FIG. 1, 102) for consumer and small business printers may operate in two output modes, Normal and Sleep, by way of a control signal from the printing device's main circuit board. The PS (FIG. 1, 102), in one example, may provide a single regulated output of nominal 32 V DC in Normal mode, and in Sleep mode, a reduced nominal output of 12 V DC. The PS's (FIG. 1, 102) Sleep mode (a reduced DC output voltage) helps reduce the electronic device's (FIG. 1, 106) total power consumption when the electronic device (FIG. 1, 106) is in its Sleep and Off modes. This enables a reduction in the customer's energy cost and incrementally helps the electronic device (FIG. 1, 106) to meet U.S. ENERGY STAR standards.

The power reduction of the current monitor circuits (200, 300, 400) may occur when the electronic device (FIG. 1, 106) reduces its PS (FIG. 1, 102) output voltage $PS_{out}$ (212) upon entering low-power standby power state (i.e. a Sleep power state) and Off power states.

The incremental power savings may be small compared to active mode consumption, but the supply current for the current monitor circuit (200, 300, 400) during the Sleep and Off modes is still a significant and valuable contribution to achieving the lower power levels allowed in Sleep and Off mode. This power-savings feature for the current monitor circuit (200, 300, 400) is thereby implemented by design via the optimized selection of the Zener diode ($D_1$) (213) voltage threshold without any additional components, cost, or special firmware or firmware processing. Thus, the current monitor circuit (200, 300, 400) contributes to the electronic device (FIG. 1, 106) satisfying the ENERGY STAR standards.

Figure 5:
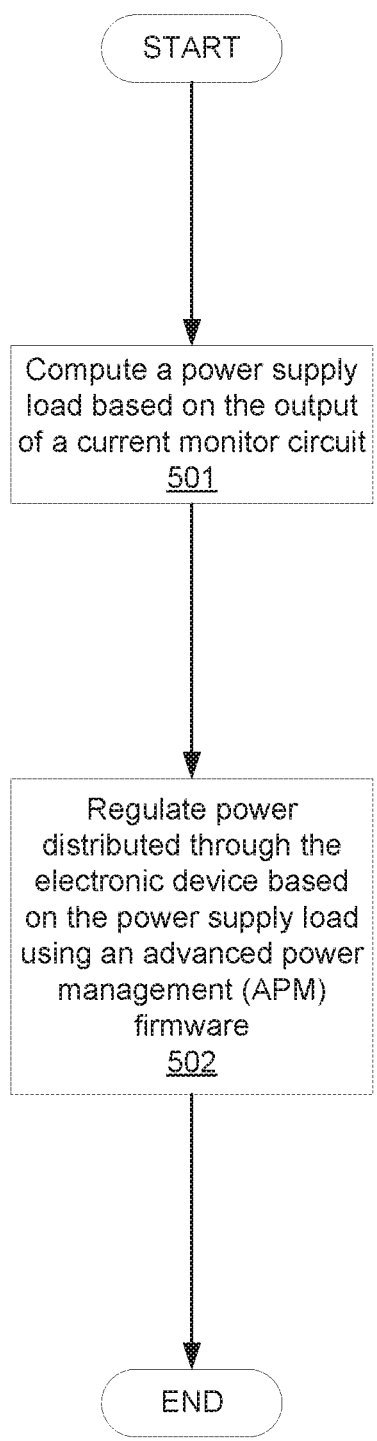
FIG. 5 is a flowchart depicting a method for monitoring a current load of a power supply, according to one example of the principles described herein.

FIG. 5 is a flowchart depicting a method for monitoring a current load of a power supply (PS) (FIG. 1, 102), according to one example of the principles described herein. FIG. 5 depicts a modified method for managing the usage of power by an electronic device (FIG. 1, 106) from a PS (FIG. 1, 102). The method may include computing (block 501) a PS load based on the output of the current monitor circuit (200, 300, 400) described above in connection with FIGS. 1 through 4. Power distributed to certain loads of the electronic device (FIG. 1, 106) may be regulated (block 502) based on the PS load using Active Power Management (APM) firmware (FIG. 1, 108) stored in the data storage device (FIG. 1, 107) of, for example, the electronic device (FIG. 1, 106). In one example, the APM firmware may be any firmware developed and distributed by HP Inc. for optimized power management.

The APM firmware controls power drawn by certain loads upon demand or combinations thereof, given the values of other loads not controlled by the APM in the electronic device (FIG. 1, 106). These other loads, included in the PS load measurement by the current monitor circuit (200, 300, 400), may be a combination of characterizable and uncharacterizable loads.

The method may further include sampling, with the ADC (FIG. 1, 105), the voltage output by the current monitor circuit (200, 300, 400), as described herein. Sampling, with the ADC (FIG. 1, 105), the voltage output by the current monitor circuit (200, 300, 400) may include sampling at a sampling rate of, in one example, approximately once every 10 milliseconds (ms). However, any sampling rate may be chosen based on system and performance characteristics of the electronic device (FIG. 1, 106).

Figure 6:
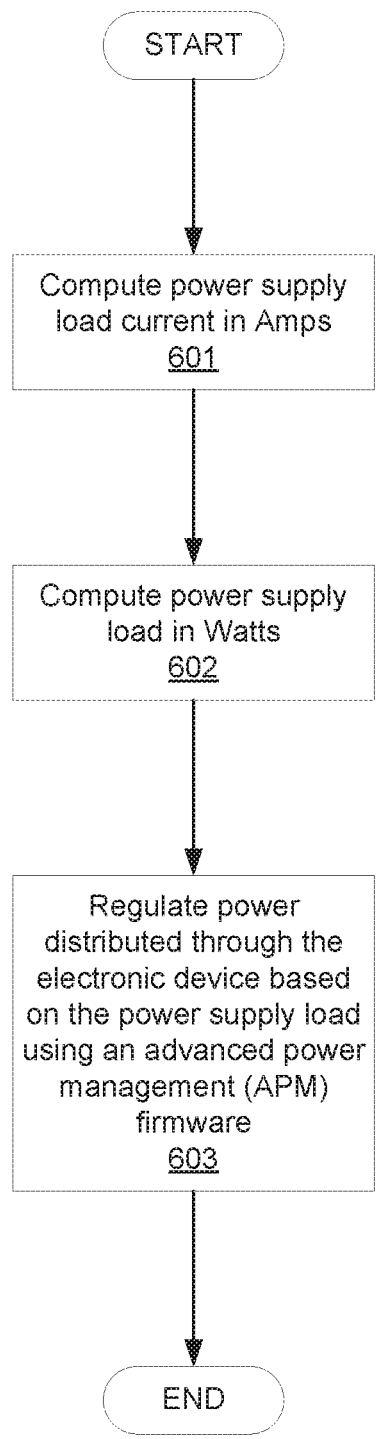
FIG. 6 is a flowchart depicting a method for monitoring a current load of a power supply, according to another example of the principles described herein.

FIG. 6 is a flowchart depicting a method for monitoring a current load of a PS (FIG. 1, 102), according to another example of the principles described herein. The method of FIG. 6 may begin by computing (block 601) a PS load current in amperes (A), and PS load in Watts (W) is computed (block 602). The load at the PS in amperes ($PS_{Load(A)}$) may be expressed as provided in Eq. 2 and reproduced below again as follows:

$$PS_{Load\,(A)} = (V_{sense} - 0.181\text{ V}) * 1\frac{A}{V} \qquad \text{Eq. 2}$$

In block 602, the PS power in Watts (W) may be calculated. Unless the positive power supply (PS V+) is measured accurately with the ADC (FIG. 1, 105), the nominal power supply (PS) output ($V_{supply}$) may be used, for example, 32 V. The PS load in Watts ($PS_{Load(W)}$) is as follows:

$$PS_{Load(W)} = V_{Supply} * PS_{Load(A)} \qquad \text{Eq. 3}$$

Note that, for the value of $V_{Supply}$ in this calculation, the ADC (FIG. 1, 105) may be able to measure the positive power supply voltage (PS V+) for better accuracy instead of using its specified nominal value.

The calculated PS power of Equation 3 may be reported to the APM firmware (FIG. 1, 108) as the present value for system PS load power. The APM firmware (FIG. 1, 108) associated with the current monitor circuit (200, 300, 400) passes this measured value of the PS load to a processing device associated with the electronic device (FIG. 1, 106). The APM firmware (FIG. 1, 108) uses this value to regulate the additional system power demanded by the current applications and power clients such as, for example, printing elements within a printing device acting as the electronic device (FIG. 1, 106) so as to prevent or reduce excess power supply temperatures and to prevent or reduce tripping a power supply over-current protection (OCP) feature present in the PS (FIG. 1, 102).

FIG. 7 is a diagram of an extended current monitor circuit (700), according to one example of principles described here. Again, similarly-numbered elements included in FIGS. 1 through 4 and described in connection with FIGS. 1 through 4 designate similar elements within the current monitor circuit (700) of FIG. 7, With regard to the extended current monitor circuit (700) of FIG. 7, an electronic device (FIG. 1, 106) may include a plurality of single-output power supplies and power supplies with multiple outputs, such as represented by output 1 (701), output 2 (702), and output 3 (703) from the DC power supply (PS) (102). These outputs may be connected to a number of individual current monitor circuits (706-1, 706-2, 706-3). Although three power output supplies (702, 703, 704) and three current monitor circuits (706-1, 706-2, 706-3) are depicted in FIG. 7, any number of power output supplies (702, 703, 704) and current monitor circuits (706-1, 706-2, 706-3) may be included. Further, the current monitor circuits (706-1, 706-2, 706-3) may each be any one of the current monitor circuits (100, 200, 300, 400) of FIGS. 1 through 4.

A printing device may use multiple output power supplies (701, 702, 703) all of which may differ in output voltage, power ratings, or combinations thereof. Each of the multiple output power supplies (701, 702, 703) may also experience situations where they are used to power unpredictable variable loads as measured by the current monitor circuits (100, 200, 300, 400) of FIGS. 1 through 4. Thus, the various gains (704-1, 704-2, 704-3) obtained from each of the current monitor circuits (706-1, 706-2, 706-3) may be directed to a multiplexer (MUX) (705).

In one example, the MUX (705) is a 4-line to 1-line analog multiplexer. The multiplexer (MUX) (705) may include a number of pins including for example, a number of selectable input pins ($S_1$, $S_2$, $S_3$, $S_4$), a number of output pins (D), a number of enable inputs (EN) to operate the MUX (705), a number of control inputs ($C_1$, $C_2$) to control the MUX (705), other pins and inputs and outputs, or combinations thereof. In an example of 4-line to 1-line multiplexer, a truth table for an analog MUX (705) may be as follows:

TABLE 1

Truth Table for 4-line to 1-line analog multiplexer

| Control Inputs | | | Output |
|---|---|---|---|
| EN | $C_2$ | $C_1$ | D |
| 0 | X | X | OFF (Hi impedance output) |
| 1 | 0 | 0 | $S_1$ |
| 1 | 0 | 1 | $S_2$ |
| 1 | 1 | 0 | $S_3$ |
| 1 | 1 | 1 | $S_4$ |

When the enable input (EN) is set to logic 1, control logic signals on the $C_1$ and $C_2$ control inputs determine which of the analog inputs ($S_1$, $S_2$, $S_3$, $S_N$) is selected or connected to the output D. An "X" in Table 1 refers to a "Don't Care" input logic condition. The selected input of the MUX (705) is sent to the ADC (FIG. 1, 105) as designated by "B" which indicates the point of output of a signal to the ADC (105). In this manner, an electronic device (FIG. 1, 106) that includes an extended current monitor circuit (700) with a plurality of output power supplies (701, 702, 703) and current monitor circuits (706-1, 706-2, 706-3) allows for the electronic device (FIG. 1, 106) to handle multiple power supplies with differing output voltages and power ratings, which power unpredictable variable loads.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general-purpose computer, special purpose computer, or other programmable data processing apparatus to produce a machine, such that the computer usable program code, when executed via, for example, a processing device of the electronic device (FIG. 1, 106) or other programmable data processing apparatus, implement the functions or acts as specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a current monitor circuit which includes a sense resistor coupled to a direct current (DC) power supply to sense a current signal, an operational amplifier (op-amp) coupled to the sense resistor to sense a voltage developed across the sense resistor, and a low-pass filter coupled to the op-amp and an analog-to-digital converter (ADC). The low-pass filter reduces aliasing due to out-of-band signal content. The current monitor circuit is coupled to the ADC to provide real-time measurements of power supply load current as input to an active power management (ARM) firmware.

The current monitor circuit provides for measurement of an actual PS load rather than using a worst-case characterization or estimation, or using models for the various circuit load currents within an associated electronic device. An active power management (ARM) firmware (FIG. 1, 108) may reliably obtain more useful power from the PS because there are no assumptions made as to all variable uncharacterizable loads such as, for example, battery charging, universal serial bus (USB) loads, hard disk drive loads, and audio power amplifier loads when operating at their maximum power levels. Further, no maintaining a margin for unknown increases in load factors such as, for example, aging, wear and tear, temperature, and component tolerances is performed. This allows an electronic device such as a printer, for example, to print longer before the printing rate or power consumption is reduced for PS thermal reasons. The current monitor circuit and its associated ADC and digital control systems may measure the PS load in real time at a minimal cost that is easily offset by much greater savings in using a PS specified for lower output power. The non-recurring engineering (NRE) expenses and labor to model, code, and validate the power consumed by variable loads in real time such as displays, motors, print heads, data drives, and other power loads are reduced or eliminated.

Further, where the electronic device may tolerate time-delayed product functions and/or reduced throughput, the current monitor circuit allows the electronic device's controller to reliably and efficiently operate using a smaller, lower-cost PS closer to its rated limits because of the cost-effective monitoring of the system load in real-time. Further, savings occurs at the higher program level with the current monitor circuit. There is less effort and cost for characterizing, documenting, formulaically determining, and verifying the electronic device's loads. That NRE savings may translate into substantial net amortized NRE savings per unit, especially for lower volume products.

The preceding description has been presented to illustrate and describe examples of the principles described. This description is not intended to be exhaustive or to limit these principles to any precise form disclosed. Many modifications and variations are possible in light of the above teaching.

What is claimed is:

1. A current monitor circuit comprising:
    a sense resistor coupled to a direct current (DC) power supply to sense a current signal;
    an operational amplifier (op-amp) coupled to the sense resistor to sense a voltage developed across the sense resistor; and
    a low-pass filter coupled to the op-amp and an analog-to-digital converter (ADC), the low-pass filter to reduce aliasing due to out-of-band signal content,
    wherein the current monitor circuit is coupled to the ADC to provide real-time measurements of power supply load current.

2. The current monitor circuit of claim 1, further comprising a unity gain buffer to reduce offset errors induced by a leakage current at an input to the ADC, a multiplexer coupled to the current monitor circuit, or a combination thereof.

3. The current monitor circuit of claim 1, further comprising a Zener diode to reduce the power supply voltage to meet a rated maximum voltage of the op-amp.

4. The current monitor circuit of claim 1, wherein the output of the op-amp is design-selected to a proportionally scaled factor of the power supply load current that flows through the sense resistor.

5. The current monitor circuit of claim 1, further comprising an automatic power shutdown circuit, the automatic power shutdown circuit comprising:
    a Zener diode coupled to the power supply input of the op amp,
    wherein the Zener diode reduces power consumption by the current monitor circuit in an electronic device when the supply voltage changes from a value in a first operation mode to a lower value in a second operation mode.

6. The current monitor circuit of claim 1, wherein the current monitor circuit supports an ADC sampling rate to track the PS load current in real time.

7. The current monitor circuit of claim 1, further comprising a voltage divider coupled between the sense resistor and a positive terminal of the op-amp to provide a positive offset to compensate for an offset within the op-amp and ADC.

8. A system to monitor a current load comprising:
a direct current (DC) power supply to supply power to an electronic device;
a current monitor circuit comprising:
 a sense resistor coupled to a direct current (DC) power supply to sense a current signal;
 an operational amplifier (op-amp) coupled to the sense resistor to sense a voltage developed across the sense resistor; and
 a low-pass filter coupled to the op-amp and an analog-to-digital converter (ADC), the low-pass filter to remove aliasing due to out-of-band signal content; and
wherein the current monitor circuit;
 computes a power supply load based on the output of the current monitor circuit; and
 regulates power distributed through the electronic device based on the power supply load.

9. The system of claim 8, wherein the current monitor circuit further comprises an automatic power shutdown circuit, the automatic power shutdown circuit comprising:
a Zener diode coupled to an inverting input of the op amp, wherein the Zener diode reduces power consumption by the current monitor circuit in an electronic device when the supply voltage changes from a value in a first operation mode to a lower value in a second operation mode.

10. The system of claim 8, wherein the current monitor circuit further comprises a unity gain buffer to reduce a leakage current within an input of the ADC.

11. The system of claim 8, wherein the current monitor circuit is coupled to the ADC to provide real-time measurements of power supply load current as input.

12. A computer program product for monitoring a current load of a power supply, the computer program product comprising:
a non-transitory computer readable storage medium comprising computer usable program code embodied therewith, the computer usable program code to, when executed by a processor:
 compute a power supply load based on the output of a current monitor circuit, the current monitor circuit comprising:
  a sense resistor coupled to a direct current (DC) power supply to sense a current signal;
  at least one operational amplifier (op-amp) coupled to the sense resistor to sense a voltage developed across the sense resistor; and
  a low-pass filter coupled to the op-amp and an analog-to-digital converter (ADC), the low-pass filter to remove aliasing due to out-of-band signal content; and
 regulate power distributed through the electronic device based on the power supply load.

13. The computer program product of claim 12, wherein the current monitor circuit further comprises a buffer op-amp to reduce offset errors induced by a leakage current at the ADC, a multiplexer coupled to the current monitor circuit, or a combination thereof, wherein the output of the buffer op-amp is coupled to the ADC, the multiplexer, or a combination thereof.

14. The computer program product of claim 12, wherein regulating power distributed through the electronic device based on the power supply load comprises using active power management (APM) and regulating characterizable and uncharacterizable loads of a number of subsystems of the electronic device to which the current monitor circuit is coupled to utilize the load capability of the power supply.

15. The computer program product of claim 12, further comprising computer usable program code to, when executed by the processor sample, with the ADC, the voltage output by the current monitor circuit at a sampling rate sufficient to track the PS load in real time, such as at least once every 10 milliseconds (ms).

* * * * *